(12) United States Patent
Huang et al.

(10) Patent No.: US 10,032,734 B2
(45) Date of Patent: Jul. 24, 2018

(54) SEMICONDUCTOR PACKAGE SYSTEM AND METHOD

(71) Applicant: Taiwan Semiconductor Manufacturing Company, Ltd., Hsin-Chu (TW)

(72) Inventors: Hui-Min Huang, Taoyuan (TW); Chih-Wei Lin, Zhubei (TW); Tsai-Tsung Tsai, Taoyuan (TW); Ming-Da Cheng, Jhubei (TW); Chung-Shi Liu, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/268,739

(22) Filed: Sep. 19, 2016

(65) Prior Publication Data
US 2017/0005049 A1    Jan. 5, 2017

Related U.S. Application Data

(62) Division of application No. 14/447,371, filed on Jul. 30, 2014, now Pat. No. 9,449,908.

(51) Int. Cl.
*H01L 23/00* (2006.01)
*H01L 21/48* (2006.01)
(Continued)

(52) U.S. Cl.
CPC ............ *H01L 24/05* (2013.01); *H01L 21/481* (2013.01); *H01L 21/486* (2013.01); *H01L 21/56* (2013.01); *H01L 21/561* (2013.01); *H01L 23/3114* (2013.01); *H01L 23/3135* (2013.01); *H01L 23/481* (2013.01); *H01L 23/49811* (2013.01); *H01L 23/49833* (2013.01); *H01L 23/49838* (2013.01); *H01L 23/49861* (2013.01); *H01L 23/49866* (2013.01); *H01L 23/5389* (2013.01);
(Continued)

(58) Field of Classification Search
CPC ..... H01L 21/481; H01L 21/486; H01L 21/56; H01L 21/561; H01L 23/3114; H01L 23/3135; H01L 23/481; H01L 24/05; H01L 24/13; H01L 24/19; H01L 24/96; H01L 24/97
See application file for complete search history.

(56) References Cited

U.S. PATENT DOCUMENTS 7,666,709 B1   2/2010  Lin et al.
8,169,065 B2   5/2012  Kohl et al.
(Continued)

FOREIGN PATENT DOCUMENTS

CN   1633705 A      6/2005
CN   202423279 U    9/2012
(Continued)

*Primary Examiner* — Armando Rodriguez
(74) *Attorney, Agent, or Firm* — Slater Matsil, LLP

(57) ABSTRACT

A first protective layer is formed on a first die and a second die, and openings are formed within the first protective layer. The first die and the second die are encapsulated such that the encapsulant is thicker than the first die and the second die, and vias are formed within the openings. A redistribution layer can also be formed to extend over the encapsulant, and the first die may be separated from the second die.

20 Claims, 9 Drawing Sheets

(51) Int. Cl.
*H01L 21/56* (2006.01)
*H01L 23/498* (2006.01)
*H01L 23/31* (2006.01)
*H01L 23/538* (2006.01)
*H01L 23/48* (2006.01)

(52) U.S. Cl.
CPC .............. *H01L 24/13* (2013.01); *H01L 24/19* (2013.01); *H01L 24/96* (2013.01); *H01L 24/97* (2013.01); *H01L 21/568* (2013.01); *H01L 23/49827* (2013.01); *H01L 2224/0239* (2013.01); *H01L 2224/02372* (2013.01); *H01L 2224/0401* (2013.01); *H01L 2224/05083* (2013.01); *H01L 2224/05144* (2013.01); *H01L 2224/05147* (2013.01); *H01L 2224/05155* (2013.01); *H01L 2224/05166* (2013.01); *H01L 2224/05171* (2013.01); *H01L 2224/05184* (2013.01); *H01L 2224/12105* (2013.01); *H01L 2224/13111* (2013.01); *H01L 2224/13139* (2013.01); *H01L 2224/13147* (2013.01); *H01L 2224/2919* (2013.01); *H01L 2224/2929* (2013.01); *H01L 2224/29386* (2013.01); *H01L 2224/83191* (2013.01); *H01L 2224/94* (2013.01); *H01L 2924/01029* (2013.01); *H01L 2924/18162* (2013.01)

(56) References Cited

U.S. PATENT DOCUMENTS

| | | | |
|---|---|---|---|
| 8,772,152 | B2 | 7/2014 | Co et al. |
| 8,907,476 | B2 | 12/2014 | Lin et al. |
| 2006/0087042 | A1 | 4/2006 | Kameyama et al. |
| 2006/0202353 | A1 | 9/2006 | Wakabayashi et al. |
| 2010/0144142 | A1 | 6/2010 | Yoshida |
| 2011/0156240 | A1* | 6/2011 | Luan ................ H01L 24/19 257/692 |
| 2011/0241222 | A1 | 10/2011 | Sezi et al. |
| 2011/0266701 | A1 | 11/2011 | Wan et al. |
| 2013/0320522 | A1 | 12/2013 | Lai et al. |
| 2014/0110856 | A1 | 4/2014 | Lin |
| 2014/0159251 | A1 | 6/2014 | Marimuthu et al. |
| 2015/0179616 | A1 | 6/2015 | Lin et al. |
| 2017/0011936 | A1 | 1/2017 | Lin et al. |

FOREIGN PATENT DOCUMENTS

| | | |
|---|---|---|
| CN | 103715108 A | 4/2014 |
| JP | 2005216941 A | 8/2005 |
| JP | 2010135554 A | 6/2010 |
| KR | 20060049323 A | 5/2006 |
| KR | 20130134991 A | 12/2013 |
| TW | 201142932 A | 12/2011 |
| TW | 201347059 A | 11/2013 |
| TW | 201423851 A | 6/2014 |

* cited by examiner

SEMICONDUCTOR PACKAGE SYSTEM AND METHOD

PRIORITY CLAIM AND CROSS-REFERENCE

This application is a divisional of U.S. patent application Ser. No. 14/447,371, entitled "Semiconductor Package System and Method," filed on Jul. 30, 2014, which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
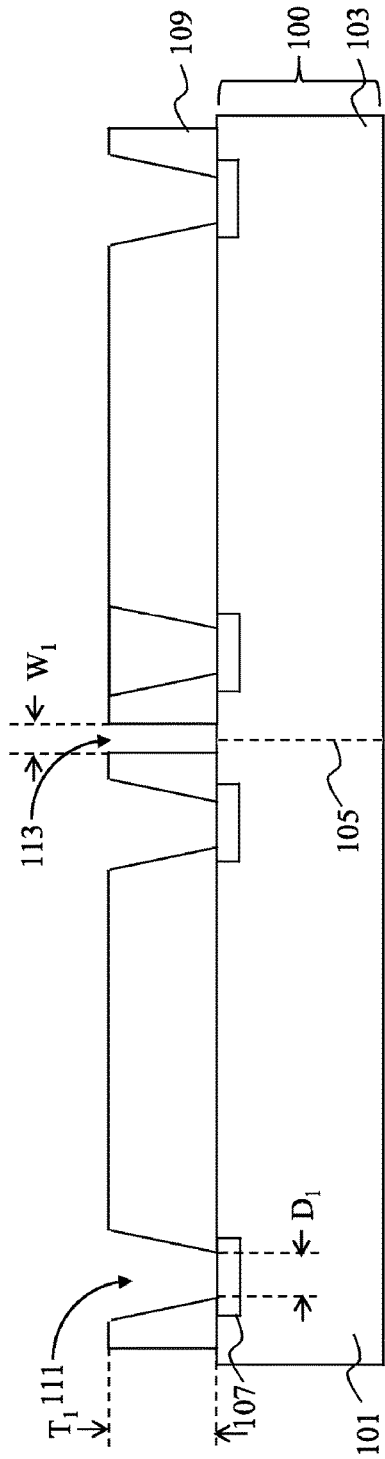
FIG. 1 illustrates a wafer with a first protective layer in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference now to FIG. 1, there is illustrated a wafer 100 with a first die 101 and a second die 103 formed within and over the wafer 100, which will, in one embodiment be used in an integrated fanout (INFO) wafer level chip scale package (WLCSP) that is suitable for use in a package on package (PoP) configuration. In an embodiment the first die 101 and the second die 103 are formed within the wafer 100 separated by a first scribe region (represented in FIG. 1 by the dashed line labeled 105) along which the wafer 100 will be separated to form the individual ones of the first die 101 and the second die 103. In an embodiment the wafer 100 (and, as such, the first die 101 and the second die 103) may comprise a substrate, first active devices, metallization layers (not separately illustrated in FIG. 1), and contact pads 107. In an embodiment the substrate may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional parts of the design for the first die 101 and the second die 103. The first active devices may be formed using any suitable methods either within or else on the substrate.

The metallization layers are formed over the substrate and the first active devices and are designed to connect the various first active devices to form functional circuitry for both the first die 101 and the second die 103. In an embodiment the metallization layers are formed of alternating layers of dielectric and conductive material and may be formed through any suitable process (such as deposition, damascene, dual damascene, etc.). In an embodiment there may be four layers of metallization separated from the substrate by at least one interlayer dielectric layer (ILD), but the precise number of metallization layers is dependent upon the design of the first die 101 and the second die 103.

The contact pads 107 are formed in order to provide external contacts for the metallization layers and the first active devices. In an embodiment the contact pads 107 are formed of a conductive material such as aluminum, although other suitable materials, such as copper, tungsten, or the like, may alternatively be utilized. The contact pads 107 may be formed using a process such as CVD or PVD, although other suitable materials and methods may alternatively be utilized. Once the material for the contact pads 107 has been deposited, the material may be shaped into the contact pads 107 using, e.g., a photolithographic masking and etching process.

Over the first die 101 and the second die 103, a first protective layer 109 may be placed and patterned. In an embodiment the first protective layer 109 may be a protective material such as polybenzoxazole (PBO) or polyimide (PI), silicon oxide, silicon nitride, silicon oxynitride, benzocyclobutene (BCB), or any other suitable protective material. The first protective layer 109 may be formed using a method such as a spin-on process, a deposition process (e.g., chemical vapor deposition), or other suitable process based upon the chosen material, and may be formed to a first thickness $T_1$ of between about 1 μm and about 100 μm, such as about 20 μm.

Once formed the first protective layer 109 is patterned to form vias openings 111 and expose the contact pads 107. Additionally, the first protective layer 109 is patterned to form first openings 113 to expose the scribe region 105. This exposure of the scribe region 105 additionally recesses the first protective layer 109 from sidewalls of the first die 101 and the second die 103 such that sidewalls of the first protective layer 109 are laterally separated and not aligned with sidewalls of the first die 101 and the second die 103 after the first die 101 has been separated from the second die 103 (described further below with respect to FIG. 2).

In an embodiment the first protective layer 109 may be patterned using, e.g., a photolithographic masking and etching process. In such a process, a first photoresist (not individually illustrated in FIG. 1) is applied to the first protective layer 109 and then exposed to a patterned light source. The light source will impinge upon the first photoresist and induce a change in a property of the first photoresist, which is then utilized to selectively remove either the exposed portion or the unexposed portion and expose the first protective layer 109. The first photoresist is then utilized as a mask during, e.g., an etching process which removes portions of the first protective layer 109 to expose the contact pads 107. Once the first protective layer 109 has been patterned, the first photoresist may be removed using, e.g., an ashing process.

In an embodiment the via openings 111 may be formed to have a first diameter $D_1$ at the bottom of between about 1 μm and about 50 μm, such as about 15 μm. Additionally, the first protective layer 109 may be patterned to expose the scribe region 105 between the first die 101 and the second die 103. For example, the first protective layer 109 may be patterned to form the first opening 113 over the scribe region 105 with a first width $W_1$ of between about 20 μm and about 150 μm, such as about 80 μm.

Figure 2:
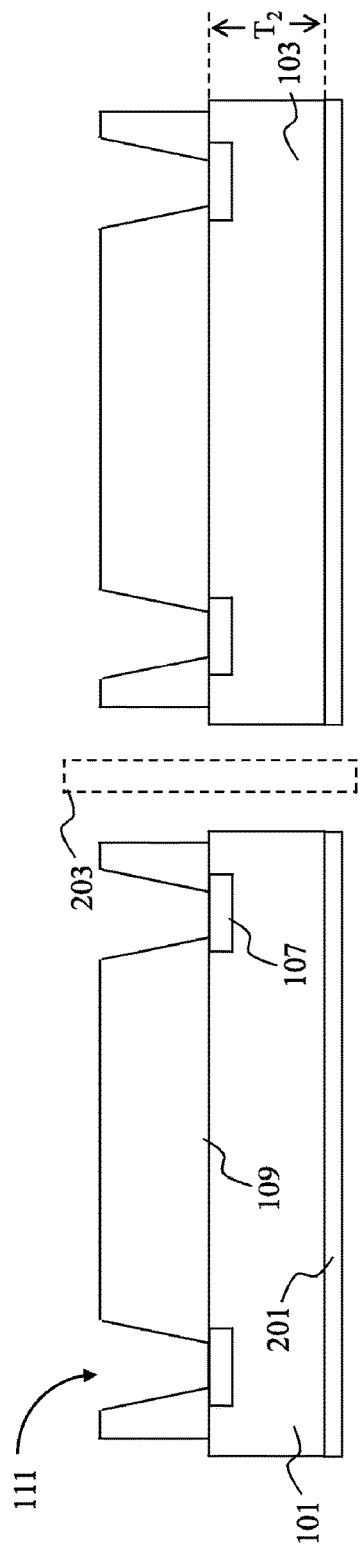
FIG. 2 illustrates a singulation of the wafer into a first die and a second die in accordance with some embodiments.

FIG. 2 illustrates that, once the via openings 111 have been formed, the wafer 100 in general and the first die 101 and the second die 103 in particular may be thinned. In an embodiment the wafer 100 may be thinned using, e.g., chemical mechanical polishing, whereby a combination of chemical reactants and abrasives are utilized with one or more grinding pads in order to remove portions of the wafer 100 opposite the contact pads 107. However, any other suitable process, such as a physical grinding process, an etching process, or combinations of these, may alternatively be utilized. In an embodiment the wafer 100 is thinned to have a second thickness $T_2$ of between about 30 μm and about 700 μm, such as about 250 μm.

Once thinned, a die attach film (DAF) 201 may be applied to the first die 101 and the second die 103 in order to assist in the attachment of the first die 101 and the second die 103 to a carrier wafer 301 (not illustrated in FIG. 1 but illustrated and described below with respect to FIG. 3). In an embodiment the die attach film 201 is an expoy resin, a phenol resin, acrylic rubber, silica filler, or a combination thereof, and is applied using a lamination technique. However, any other suitable alternative material and method of formation may alternatively be utilized.

After the die attach film 201 has been applied, the first die 101 and the second die 103 may be singulated and separated from the remainder of the wafer 100. In an embodiment a laser may be used to form grooves within the wafer 100 within the scribe region 105. Once the grooves have been formed, the singulation may be performed by using a saw blade (represented in FIG. 2 by the dashed box labeled 203) to slice the wafer 100 within the scribe region 105 between the first die 101 and the second die 103, thereby separating the first die 101 and the second die 102 from each other and separating the wafer 100 into the individual dies.

However, as one of ordinary skill in the art will recognize, utilizing the saw blade 203 to singulate the first die 101 and the second die 103 from the wafer 100 is merely one illustrative embodiment and is not intended to be limiting. Alternative methods for singulating the first die 101 and the second die 103, such as utilizing one or more etches to separate the first die 101 and the second die 103 from the wafer 100, may alternatively be utilized. These methods and any other suitable methods may alternatively be utilized to singulate the wafer 100 into the first die 101 and the second die 103.

Figure 3:
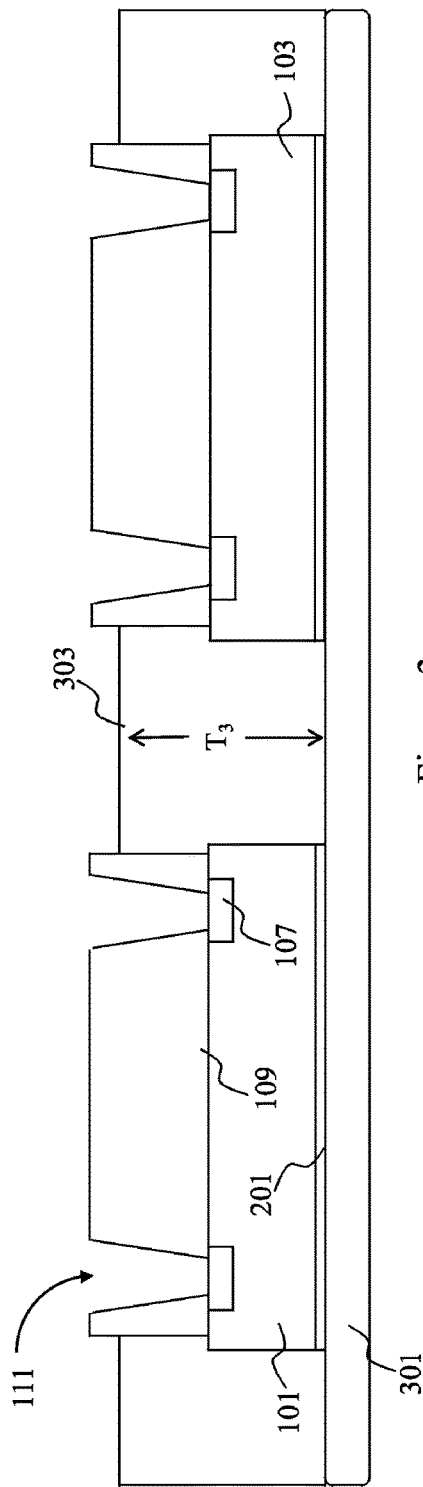
FIG. 3 illustrates an encapsulation of the first die and the second die in accordance with some embodiments.

FIG. 3 illustrates an attachment of the first die 101 and the second die 103 to a carrier wafer 301 and an encapsulation of the first die 101 and the second die 103 with an encapsulant 303. In an embodiment the carrier wafer 301 may comprise, for example, glass, silicon oxide, aluminum oxide, and the like. The carrier wafer 301 may have a thickness that is greater than about 12 mils. The first die 101 and the second die 103 may be attached, e.g., using the die attach film 201 or other suitable adhesive.

Once attached to the carrier wafer 301, the first die 101 and the second die 103 may be encapsulated with the encapsulant 303 in order to provide protection as well as to provide another surface for further processing (described further below with respect to FIGS. 3-8). In an embodiment the encapsulant 303 may be a molding compound and may be placed using a molding device. For example, the first die 101 and the second die 103 may be placed within a cavity of the molding device (not illustrated in FIG. 2), and the cavity may be hermetically sealed.

In an embodiment the first die 101 and the second die 103 are placed within the molding device such that the molding device covers the via openings 111 and the encapsulant 303 does not enter the via openings 111 during the molding process. For example, in one embodiment, the molding device comprises a top portion and a bottom portion that are brought into contact with each other in order to form the cavity between them. The first die 101 and the second die 103 are placed on the bottom portion and the top portion is lowered to be in physical contact with the first protective layer 109 while forming the cavity. This contact between the top portion and the first protective layer 109 both forms the cavity/hermetic seal for the molding process and also seals the via openings 111 such that no encapsulant 303 can enter the via openings 111 during the encapsulation process.

However, as one of ordinary skill in the art will recognize, the use of the top portion of the molding device is merely one illustrative embodiment and is not intended to limit the embodiments. Rather, any suitable method of preventing the encapsulant 303 from entering the via openings 111 may alternatively be utilized. For example, a plate or other solid barrier may be placed in contact with the first protective layer 109 and covering the via openings 111 during the encapsulation process, or a material may be placed within the via openings 111 prior to the encapsulation process and then removed after the encapsulation process. All such processes are fully intended to be included within the scope of the embodiments.

Once the first die 101 and the second die 103 are within the cavity, the encapsulant 303 may be placed within the cavity either before the cavity is hermetically sealed or else may be injected into the cavity through an injection port. In an embodiment the encapsulant 303 may be a molding compound resin such as polyimide, PPS, PEEK, PES, a heat resistant crystal resin, combinations of these, or the like.

In an alternative embodiment, the encapsulant 303 may be chosen such that the encapsulant 303 has a dielectric function and such that a first seed layer 401 (not illustrated in FIG. 3 but illustrated and described below with respect to FIG. 4A) may be formed over and in physical contact with the encapsulant 303. For example, the encapsulant 303 may be 20 µm, 300 µm, or 690 µm. By using these materials, a separate passivation layer 405 (not illustrated in FIG. 3 but illustrated in another embodiment in FIG. 4B below), may be avoided, simplifying the overall process.

In an embodiment, the molding device is shaped to place the encapsulant 303 such that it has a third thickness $T_3$ that is greater than the first die 101 and the second die 103. For example, in an embodiment in which the first die 101 has the second thickness $T_2$ of about 200 µm, the encapsulant 303 has the third thickness $T_3$ of between about 201 µm and about 215 µm, such as about 210 µm. Additionally, in some embodiments the third thickness $T_3$, while being greater than the first thickness $T_1$, is less than the combined thickness of the first die 101 and the first protective layer 109 ($T_1+T_2$). As such, the sidewall of the first protective layer 109 may be partially covered by the encapsulant 303, with a portion of the sidewall being exposed and free from the encapsulant 303.

Additionally, because the first protective layer 901 has been recessed from the sidewalls of the first die 101 and the second die 103 (as described above with respect to FIG. 1), the encapsulant 303 will extend over and be in physical contact with the top surface of the first die 101 and the second die 103. As such, the encapsulant 303 will have a step shape as it covers a region between, e.g., the first die 101 and the first protective layer 109 over the first die 101.

Once the encapsulant 303 has been placed into the cavity such that the encapsulant 303 encapsulates the region around the first die 101 and the second die 103, the encapsulant 303 may be cured in order to harden the encapsulant 303 for optimum protection. While the exact curing process is dependent at least in part on the particular material chosen for the encapsulant 303, in an embodiment in which molding compound is chosen as the encapsulant 303, the curing could occur through a process such as heating the encapsulant 303 to between about 100° C. and about 130° C., such as about 125° C. for about 60 sec to about 3000 sec, such as about 600 sec. Additionally, initiators and/or catalysts may be included within the encapsulant 303 to better control the curing process.

However, as one having ordinary skill in the art will recognize, the curing process described above is merely an exemplary process and is not meant to limit the current embodiments. Other curing processes, such as irradiation or even allowing the encapsulant 303 to harden at ambient temperature, may alternatively be used. Any suitable curing process may be used, and all such processes are fully intended to be included within the scope of the embodiments discussed herein.

Optionally, in some embodiments the encapsulant 303 may initially be placed such that the third thickness $T_3$ is greater than the sum of the first thickness $T_1$ (for the first protective layer 109) and the second thickness $T_2$ (for the first die 101). In this embodiment, an optional planarization process may be utilized to planarize the encapsulant 303 with the first protective layer 109 (not separately illustrated in FIG. 3). In this embodiment a suitable planarization process, such as a chemical mechanical polishing process, a physical grinding process, or a series of one or more etches may be used to planarize the encapsulant 303 with the first protective layer 109.

Figure 4A:
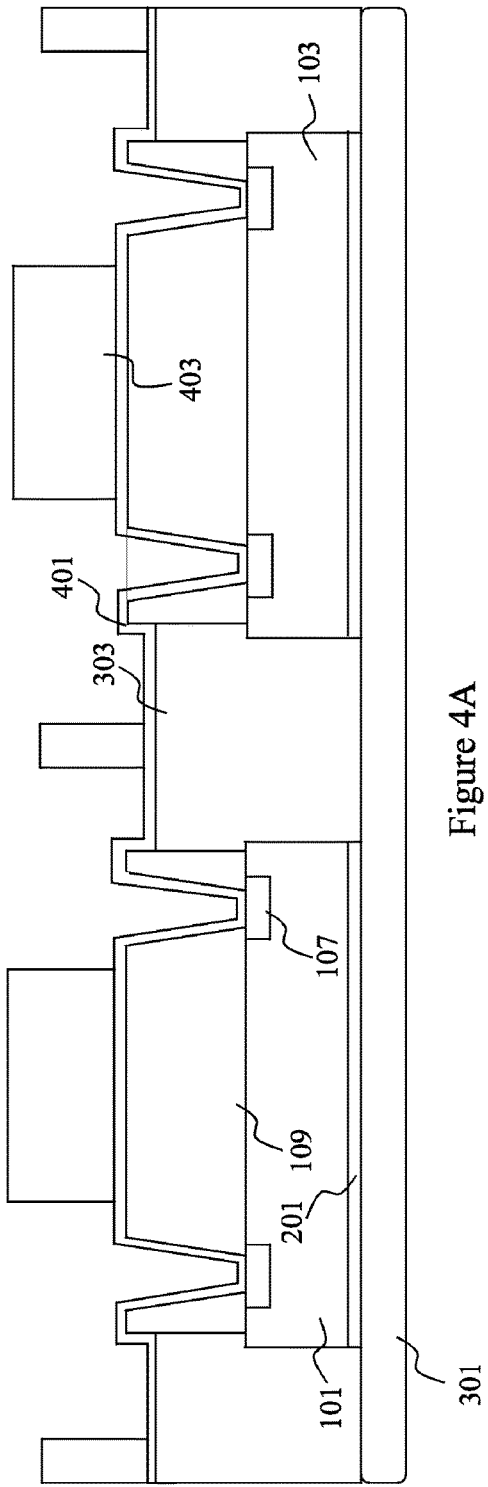
FIGS. 4A-4B illustrate a formation of a seed layer in accordance with some embodiments.

FIG. 4A illustrates a formation of a first seed layer 401 along with a second photoresist 403 formed and patterned over the first seed layer 401. The first seed layer 401 is a thin layer of a conductive material that aids in the formation of a thicker layer during subsequent processing steps. The first seed layer 401 may comprise a layer of titanium about 1,000 Å thick followed by a layer of copper about 5,000 Å thick. The first seed layer 401 may be created using processes such as sputtering, evaporation, or PECVD processes, depending upon the desired materials. The first seed layer 401 may be formed to have a thickness of between about 0.3 µm and about 1 µm, such as about 0.5 µm.

In this embodiment, the first seed layer 401 is formed such that the first seed layer 401 extends into and lines the via openings 111. Additionally, in an embodiment in which the encapsulant 303 can withstand the first seed layer 401, the first seed layer 401 also is formed over and in contact with the encapsulant 303, running along a top surface of the encapsulant 303. As such, the first seed layer 401 is formed as a continuous, single layer of material that covers the exposed top surface of the encapsulant 303 and the first protective layer 109 over the first die 101 and the second die 103.

Figure 4B:
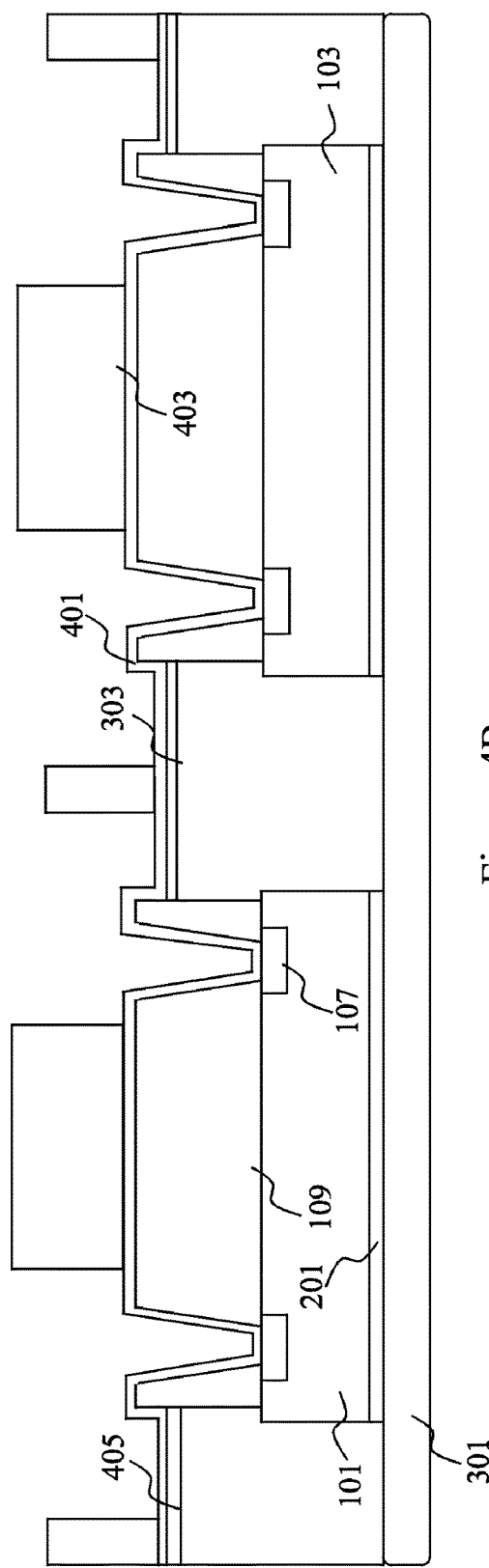

FIG. 4B illustrates an alternative embodiment, in which a passivation layer 405 is formed over the encapsulant 303 prior to formation of the first seed layer 401. In an embodiment the passivation layer 405 may be polybenzoxazole (PBO), although any suitable material, such as polyimide or a polyimide derivative, may alternatively be utilized. The passivation layer 405 may be placed using, e.g., a spin-coating process to a thickness of between about 5 µm and about 25 µm, such as about 7 µm, although any suitable method and thickness may alternatively be used.

Returning now to the embodiment described in FIG. 4A, once the first seed layer 401 has been formed, the second photoresist 403 may be placed and patterned over the first seed layer 401. In an embodiment the second photoresist 403 may be placed on the first seed layer 401 using, e.g., a spin coating technique to a height of between about 50 µm and about 250 µm, such as about 120 µm. Once in place, the second photoresist 403 may then be patterned by exposing the second photoresist 403 to a patterned energy source (e.g., a patterned light source) so as to induce a chemical reaction, thereby inducing a physical change in those portions of the second photoresist 403 exposed to the patterned light source. A developer is then applied to the exposed second photoresist 403 to take advantage of the physical changes and selectively remove either the exposed portion of the second photoresist 403 or the unexposed portion of the second photoresist 403, depending upon the desired pattern.

In an embodiment the pattern formed into the second photoresist 403 is a pattern that exposes the via openings 111 so that the via openings 111 may be filled in subsequent processing steps (described below with respect to FIG. 5). Additionally, the patterning of the second photoresist 403 also exposes portions of the first protective layer 109 and the encapsulant 303 (or, alternatively, the passivation layer 405) where a redistribution layer 501 (not illustrated in FIG. 4A but illustrated and described below with respect to FIG. 5) may be desired. Such a placement allows the area over the encapsulant 303 to be utilized for electrical routing and connection purposes.

Figure 5:
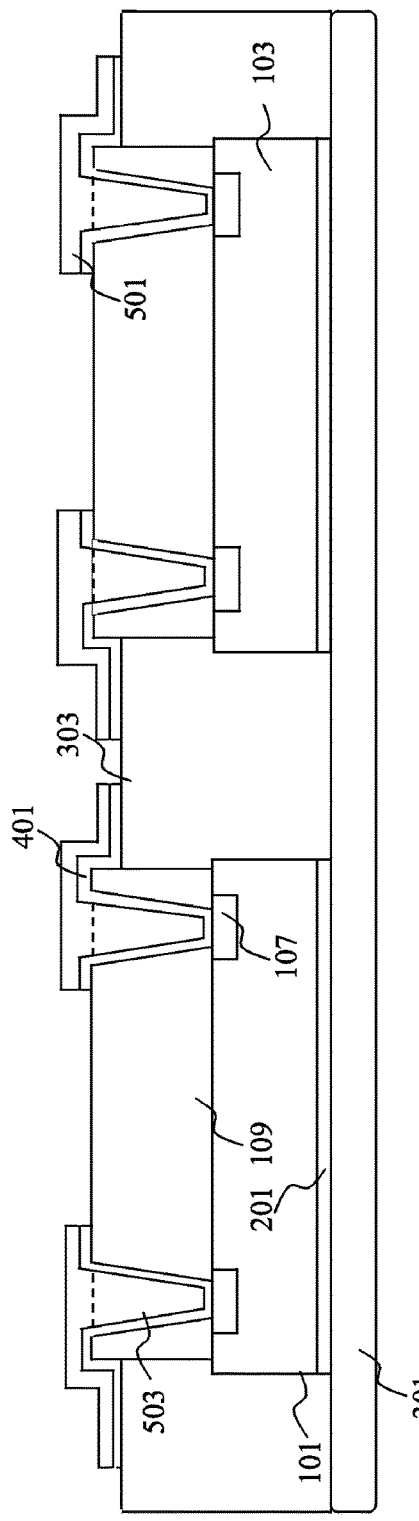
FIG. 5 illustrates a formation of vias and a redistribution layer in accordance with some embodiments.

FIG. 5 illustrates that, once the second photoresist 403 has been patterned, vias 503 and the redistribution layer 501 are formed within the second photoresist 403. In FIG. 5, the vias 503 are shown as being separate from the redistribution layer 501 by a dashed line labeled 505. However, this is intended for clarity and not necessarily a physical separation, as the vias 503 and the redistribution layer 501 may be formed using the same materials and same processes. Alternatively, if desired, the vias 503 may be formed separately from the redistribution layer 501. Additionally, while the redistribution layer 501 and the first seed layer 401 are still illustrated as separate layers within the figures, it is understood that the first seed layer 401 is actually a part of the redistribution layer 501.

In an embodiment the vias 503 and the redistribution layer 501 comprise one or more conductive materials, such as copper, tungsten, other conductive metals, or the like, and may be formed, for example, by electroplating, electroless plating, or the like. In an embodiment, an electroplating process is used wherein the first seed layer 401 and the second photoresist 403 are submerged or immersed in an electroplating solution. The first seed layer 401 surface is electrically connected to the negative side of an external DC power supply such that the first seed layer 401 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 401, acquires the dissolved atoms, thereby plating the exposed conductive areas of the first seed layer 401 within the opening of the second photoresist 403.

Once the vias 503 and the redistribution layer 501 have been formed using the second photoresist 403 and the first seed layer 401, the second photoresist 403 may be removed using a suitable removal process. In an embodiment, a plasma ashing process may be used to remove the second photoresist 403, whereby the temperature of the second photoresist 403 may be increased until the second photoresist 403 experiences a thermal decomposition and may be removed. However, any other suitable process, such as a wet strip, may alternatively be utilized. The removal of the second photoresist 403 may expose the underlying portions of the first seed layer 401.

After the removal of the second photoresist 403 exposes the underlying first seed layer 401, these portions are removed. In an embodiment the exposed portions of the first seed layer 401 (e.g., those portions that are not covered by the vias 503 and the redistribution layer 501) may be removed by, for example, a wet or dry etching process. For example, in a dry etching process reactants may be directed towards the first seed layer 401, using the vias 503 and the redistribution layer 501 as masks. Alternatively, etchants may be sprayed or otherwise put into contact with the first seed layer 401 in order to remove the exposed portions of the first seed layer 401.

Figure 6:
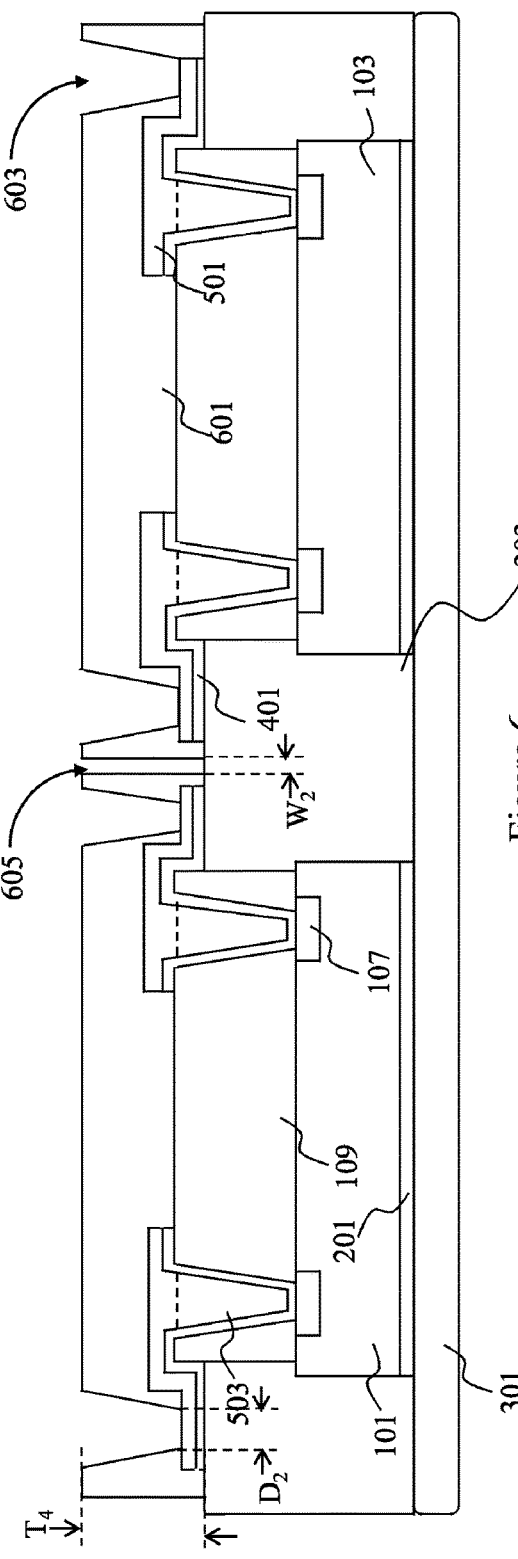
FIG. 6 illustrates a formation of a second protective layer in accordance with some embodiments.

FIG. 6 illustrates a placement and patterning of a second protective layer 601. In an embodiment the second protective layer 601 may be similar to the first protective layer 109 (described above with respect to FIG. 1). For example, the second protective layer 601 may be a PBO or polyimide material placed using a spin-on process. However, in other embodiments the second protective layer 601 is different from the first protective layer 109, and any suitable material and method of manufacture may alternatively be utilized. In an embodiment the second protective layer 601 may be formed to have a fourth thickness $T_4$ of between about 1 µm and about 10 µm, such as about 4 µm.

Once formed, the second protective layer 601 may be patterned to form second openings 603 and to expose portions of the redistribution layer 501 over the encapsulant 303 and third openings 605. In an embodiment the second protective layer 601 may be patterned using, e.g., a photolithographic masking and etching process. In such a process, a third photoresist (not individually illustrated in FIG. 6) is applied to the second protective layer 601 and then exposed to a patterned light source. The light source will impinge upon the third photoresist and induce a change in a property of the third photoresist, which is then utilized to selectively remove either the exposed portion or the unexposed portion and expose the second protective layer 601. The third photoresist is then utilized as a mask during, e.g., an etching process which removes portions of the second protective layer 601 to expose the redistribution layer 501. Once the second protective layer 601 has been patterned, the third photoresist may be removed using, e.g., an ashing process.

In an embodiment the second openings 603 may be formed to have a second diameter $D_2$ at the bottom of between about 2 µm and about 30 µm, such as about 10 µm. Additionally, while the second openings 603 in this embodiment have been illustrated and described as exposing a portion of the redistribution layer 501 over the encapsulant 303, this is only intended to be illustrative and is not intended to be limiting to the embodiments. Rather, the second openings 603 may be formed to expose any desired portions of the redistribution layer 501. All such exposures are fully intended to be included within the scope of the embodiments.

Additionally, the third openings 605 may also be formed over a region between the first die 101 and the second die 103 in preparation for an eventual separation (described further below with respect to FIG. 8). In this region, the third openings 605 may have a second width $W_2$ of between about 20 µm and about 150 µm, such as about 80 µm. Such a formation will also recess sidewalls of the second protective layer 601 away from sidewalls of the encapsulant 303 once the first die 101 has been separated from the second die 103 (described below with respect to FIG. 8).

Figure 7:
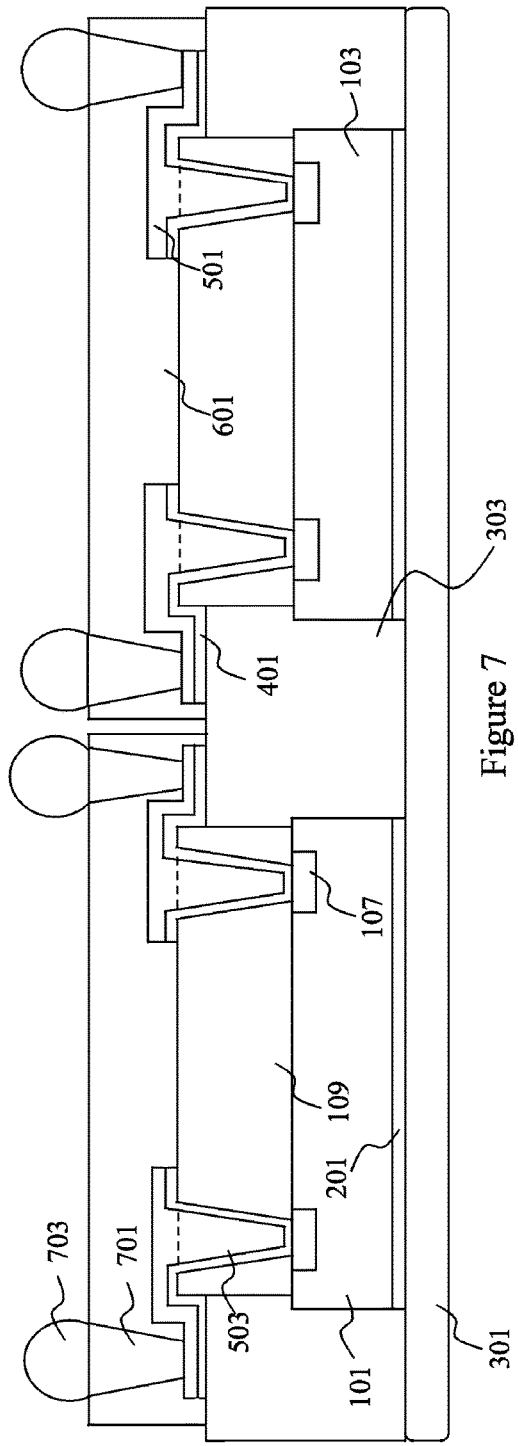
FIG. 7 illustrates a formation of underbump metallization and contact bumps in accordance with some embodiments.

FIG. 7 illustrates a formation of underbump metallizations (UBM) 701 within the vias 503 and contact bumps 703. The UBM 701 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM 701. Any suitable materials or layers of material that may be used for the UBM 701 are fully intended to be included within the scope of the embodiments.

In an embodiment the UBM 701 is created by forming each layer over the redistribution layer 501 and along the interior of the second opening 603 through the second protective layer 601. The forming of each layer may be performed using a plating process, such as electrochemical plating, although other processes of formation, such as sputtering, evaporation, or PECVD process, may alternatively be used depending upon the desired materials. The UBM 701 may be formed to have a thickness of between about 0.7 µm and about 10 µm, such as about 5 µm.

The contact bumps 703 may comprise a material such as tin, or other suitable materials, such as silver, lead-free tin, or copper. In an embodiment in which the contact bumps 703 are tin solder bumps, the contact bumps 703 may be formed by initially forming a layer of tin through such commonly used methods such as evaporation, electroplating, printing, solder transfer, ball placement, etc, to a thickness of, e.g., about 100 µm. Once a layer of tin has been formed on the structure, a reflow may be performed in order to shape the material into the desired bump shape.

Figure 8:
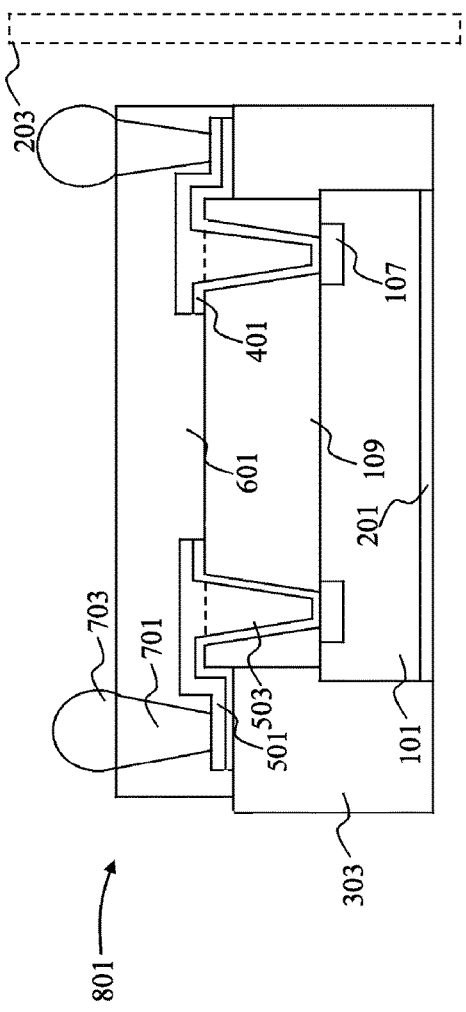
FIG. 8 illustrates a separation of the first die from the second die in accordance with some embodiments.
Figure 9:
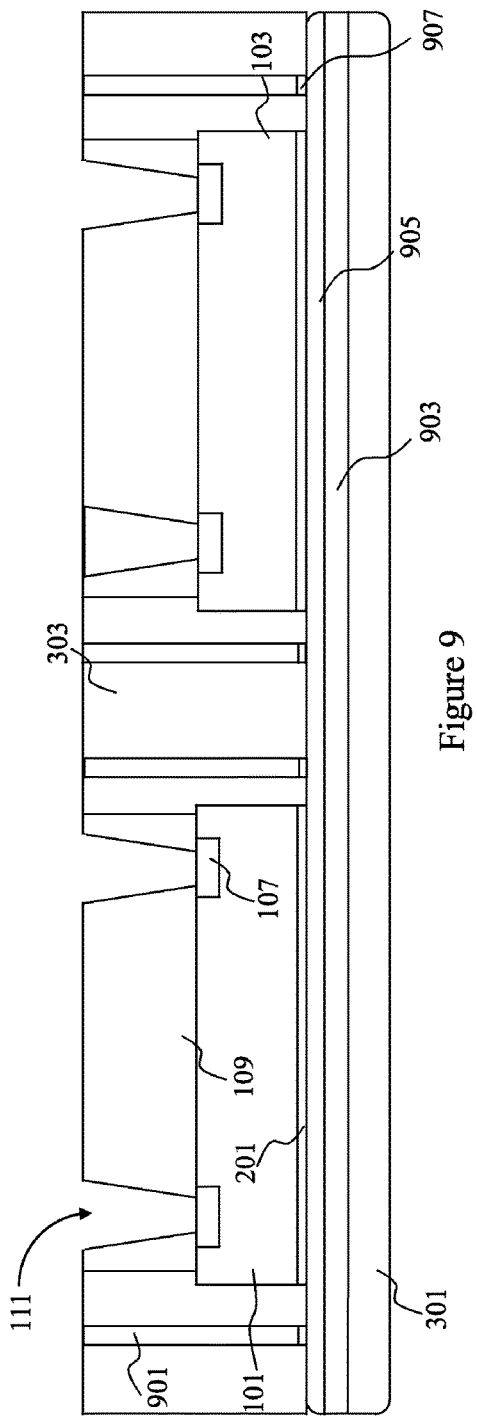
FIG. 9 illustrates an encapsulation of the first die and the second die with through vias in accordance with some embodiments.

FIG. 8 illustrates a removal of the carrier wafer 301 as well as a separation of the first die 101 from the second die 103 to form a package 801 such as an integrated fan out package. In an embodiment the carrier wafer 301 may be removed by a physical, thermal, or ultraviolet process, depending upon the material chosen for the die attach film 201. In an embodiment in which the die attach film 201 thermally decomposes, the die attach film 201 may be heated, causing it to reduce or lose its adhesiveness. The carrier wafer 301 may then be physically separated from the first die 101 and the second die 103.

Once the carrier wafer 100 has been removed, the first die 101 may be separated from the second die 103. In an embodiment the separation may be performed by using the saw blade 203 (described above with respect to FIG. 2) to slice a region of the encapsulant 303 between the first die 101 and the second die 103, thereby separating the first die 101 from the second die 102. However, any suitable method, such as a series of one or more etches or initially forming grooves prior to sawing, may alternatively be used, and all such methods are fully intended to be included within the scope of the embodiments.

By forming the vias 503 prior to the encapsulation, the die shift window can be enlarged because the land of the trace can be a customized design to cover the via opening. Additionally, by forming the via 503 first, the usual step of grinding to expose the vias 503 can be eliminated, saving cost and simplifying the process. This also allows the vias 503 to be adopted for an integrated fan out, wafer level chip scale package (INFO WLCSP).

FIGS. 9-12 illustrate another embodiment which utilizes through vias 901 that extend through the encapsulant 303 to electrically connect the redistribution layer 501 to an opposite side of the package 801. In this embodiment, prior to the first die 101 and the second die 103 being attached to the carrier wafer 301, the through vias 901 are formed over the carrier wafer 301 by initially forming an adhesive layer 903, a polymer layer 905, and a second seed layer 907 (illustrated with FIG. 9 already patterned) on the carrier wafer 301.

In an embodiment the adhesive layer 903 is placed on the carrier wafer 301 in order to assist in the adherence of overlying structures (e.g., the polymer layer 905). In an embodiment the adhesive layer 903 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive layer 903 may be placed onto the carrier wafer 301 in a semi-liquid or gel form, which is readily deformable under pressure.

The polymer layer 905 is placed over the adhesive layer 903 and is utilized in order to provide protection to, e.g., the first die 101 and the second die 103 once the first die 101 and the second die 103 have been attached. In an embodiment the polymer layer 905 may be polybenzoxazole (PBO), although any suitable material, such as polyimide or a polyimide derivative, may alternatively be utilized. The polymer layer 905 may be placed using, e.g., a spin-coating process to a thickness of between about 2 µm and about 15 µm, such as about 5 µm, although any suitable method and thickness may alternatively be used.

The second seed layer 907 is a thin layer of a conductive material that aids in the formation of a thicker layer during subsequent processing steps to form the through vias 901. The second seed layer 907 may comprise a layer of titanium about 1,000 Å thick followed by a layer of copper about 5,000 Å thick. The second seed layer 907 may be created using processes such as sputtering, evaporation, or PECVD processes, depending upon the desired materials. The second seed layer 907 may be formed to have a thickness of between about 0.3 µm and about 1 µm, such as about 0.5 µm.

Once the second seed layer 907 has been formed, a fourth photoresist (not illustrated in FIG. 9) may be placed and patterned over the second seed layer 907. In an embodiment the fourth photoresist may be placed on the second seed layer 907 using, e.g., a spin coating technique to a height of between about 50 µm and about 250 µm, such as about 120 µm. Once in place, the fourth photoresist may then be patterned by exposing the fourth photoresist to a patterned energy source (e.g., a patterned light source) so as to induce a chemical reaction, thereby inducing a physical change in those portions of the fourth photoresist exposed to the patterned light source. A developer is then applied to the exposed fourth photoresist to take advantage of the physical changes and selectively remove either the exposed portion of the fourth photoresist or the unexposed portion of the fourth photoresist, depending upon the desired pattern.

In an embodiment the pattern formed into the fourth photoresist is a pattern for the through vias 901. The through vias 901 are formed in such a placement as to be located on different sides of subsequently attached devices such as the first die 101 and the second die 103. However, any suitable arrangement for the pattern of through vias 901 may alternatively be utilized.

Once the fourth photoresist has been patterned, the through vias 901 are formed within the fourth photoresist. In an embodiment the through vias 901 comprise one or more conductive materials, such as copper, tungsten, other conductive metals, or the like, and may be formed, for example, by electroplating, electroless plating, or the like. In an embodiment, an electroplating process is used wherein the second seed layer 907 and the fourth photoresist are submerged or immersed in an electroplating solution. The second seed layer 907 surface is electrically connected to the negative side of an external DC power supply such that the second seed layer 907 functions as the cathode in the electroplating process. A solid conductive anode, such as a copper anode, is also immersed in the solution and is attached to the positive side of the power supply. The atoms from the anode are dissolved into the solution, from which the cathode, e.g., the second seed layer 907, acquires the dissolved atoms, thereby plating the exposed conductive areas of the second seed layer 907 within the opening of the fourth photoresist.

Once the through vias 901 have been formed using the fourth photoresist and the second seed layer 907, the fourth photoresist may be removed using a suitable removal process. In an embodiment, a plasma ashing process may be used to remove the fourth photoresist, whereby the temperature of the fourth photoresist may be increased until the fourth photoresist experiences a thermal decomposition and may be removed. However, any other suitable process, such as a wet strip, may alternatively be utilized. The removal of the fourth photoresist may expose the underlying portions of the second seed layer 907.

After the removal of the fourth photoresist exposes the underlying second seed layer 907, these portions are removed. In an embodiment the exposed portions of the second seed layer 907 (e.g., those portions that are not covered by the through vias 901) may be removed by, for example, a wet or dry etching process. For example, in a dry etching process reactants may be directed towards the second seed layer 907, using the through vias 901 as masks. Alternatively, etchants may be sprayed or otherwise put into contact with the second seed layer 907 in order to remove the exposed portions of the second seed layer 907. After the exposed portion of the second seed layer 907 has been etched away, a portion of the polymer layer 905 is exposed between the through vias 901.

Once the through vias 901 have been formed, the first die 101 and the second die 103 are placed on the carrier wafer 301 (in contact with the polymer layer 905) using, e.g., the die attach film 201. Once attached, the first die 101, the second die 103, and the through vias 901 may be encapsulated by the encapsulant 303 as described above with respect to FIG. 3. For example, the first die 101, the second die 103, and the through vias 901 may be placed into a molding device (not illustrated in FIG. 9) and the encapsulant 303 may be placed into the molding device and then cured.

After the encapsulant 303 has been placed and cured, a planarization process may be performed in order to planarize the encapsulant 303, the through vias 901, and the first protective layer 109 and to expose the through vias 901. In an embodiment the planarization process may be, e.g., a chemical mechanical polishing process, although any suitable process, such as physical grinding or etching, may alternatively be used.

Figure 10:
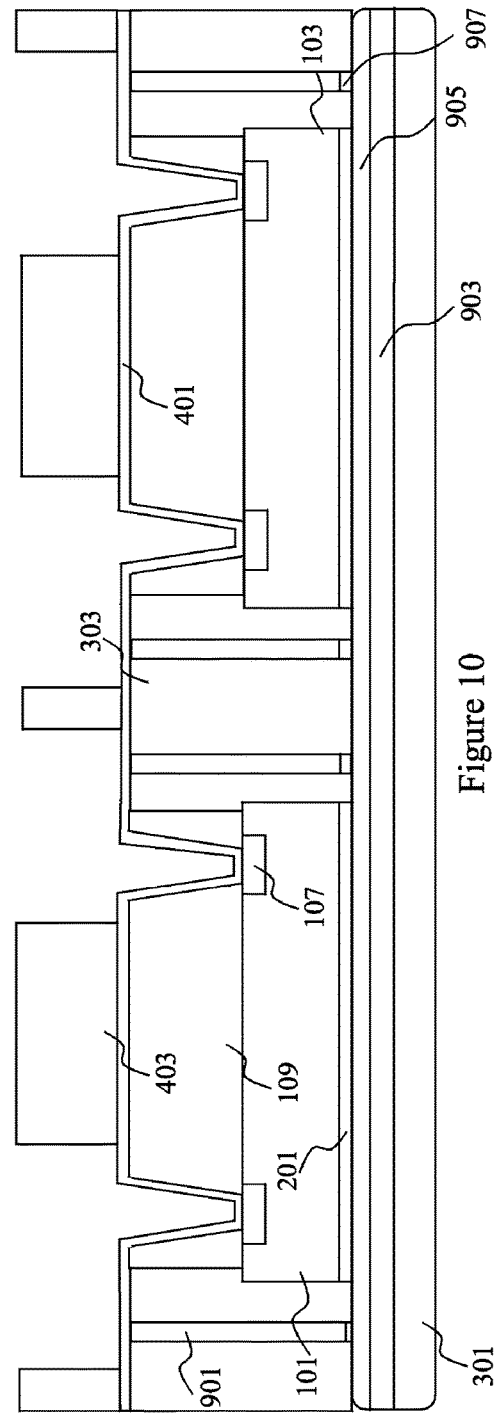
FIG. 10 illustrates a formation of the seed layer in electrical contact with the through vias in accordance with some embodiments.

FIG. 10 illustrates a placement of the first seed layer 401 within the via openings 111 as well as over the first protective layer 109, the encapsulant 303, and in electrical connection with the through vias 901. The first seed layer 401 may be formed as described above with respect to FIG. 4. For example, the first seed layer 401 may be copper formed by sputtering, although any suitable material and process may alternatively be utilized. However, by forming the first seed layer 401 in electrical connection with the through vias 901, the first seed layer is electrically connected to a second side of the package 801, allowing for electrical connection to electrical routing, either through an external connection (e.g. a bump or copper pillar), or else to another redistribution layer formed on the opposite side of the package 801.

Additionally, FIG. 10 also illustrates the formation of the second photoresist 403 over the first seed layer 401. In this embodiment, the second photoresist 403 may be placed and exposed as described above with respect to FIG. 4. However, the second photoresist 403 is patterned so as to not be located over the through vias 901.

Figure 11:
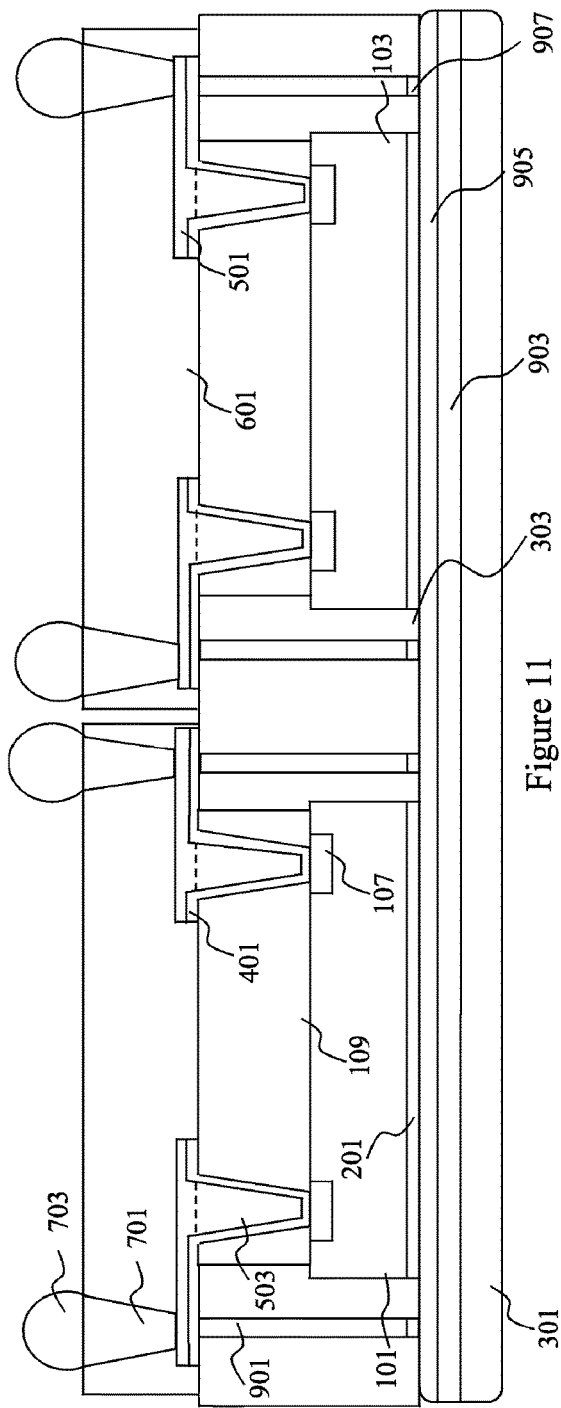
FIG. 11 illustrates a formation of the redistribution layer, the underbump metallization, and the contact bumps in electrical connection with the through vias in accordance with some embodiments.

FIG. 11 illustrates a formation of the redistribution layer 501, the second protective layer 601, the UBM 701, and the contact bumps 703. These may be formed as described above with respect to FIGS. 4-7. However, with the inclusion of the through vias 901, the redistribution layer 501, the UBMs 701 and the contact bumps 703 are electrically connected to the through vias 901 and, consequently, to the second side of the package.

Figure 12:
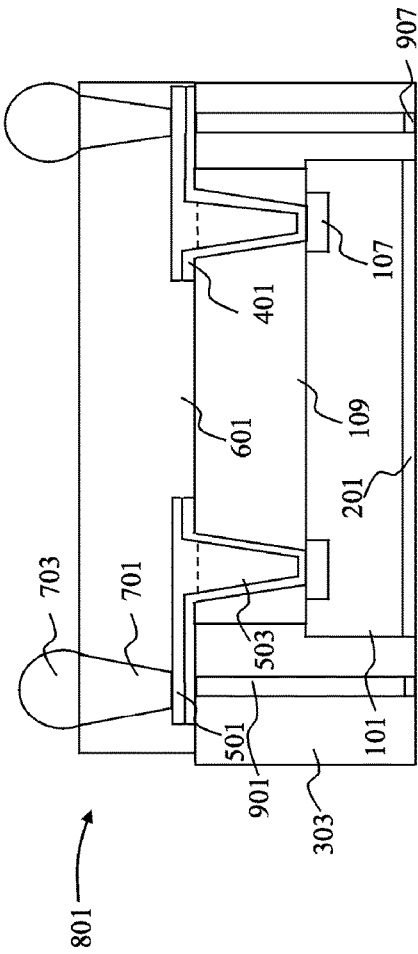
FIG. 12 illustrates a separation of the first die and the second die with the through vias in accordance with some embodiments in accordance with some embodiments.

FIG. 12 illustrates a separation of the first die 101 from the second die 103 to form the package 801 using, e.g., a laser grooving or drilling process followed by the saw blade 203 being used to separate the first die 101 from the second die 103. However, in this embodiment the package 801 also comprises the through vias 901 that connect the redistribution layer 501 with the second side of the package 801 opposite the redistribution layer 501. Such a connection allows for further options for electrical routing around the package 801.

Figure 13A:
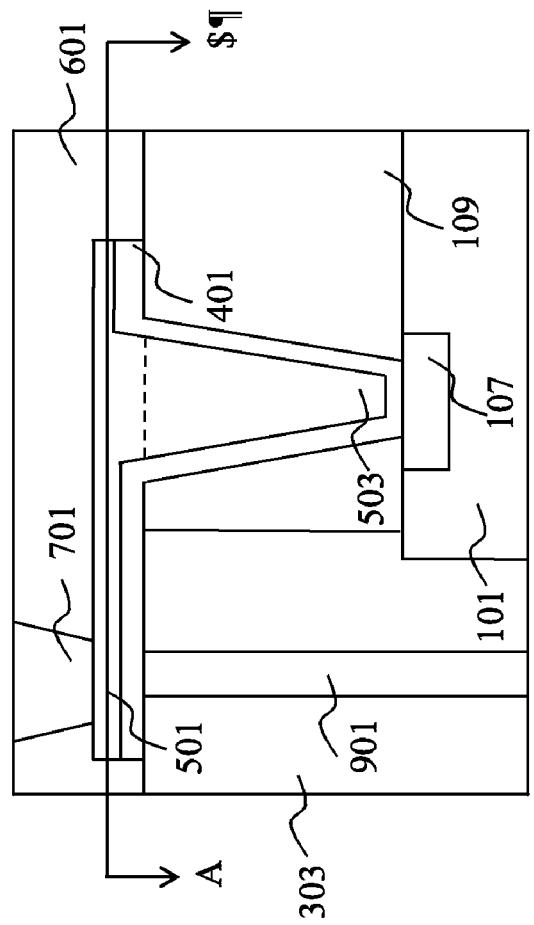
FIGS. 13A-13C illustrate an enlarged cross section and two associated top down views of the contact pad, the via, the redistribution layer, and the through via in accordance with some embodiments.
Figure 13C:
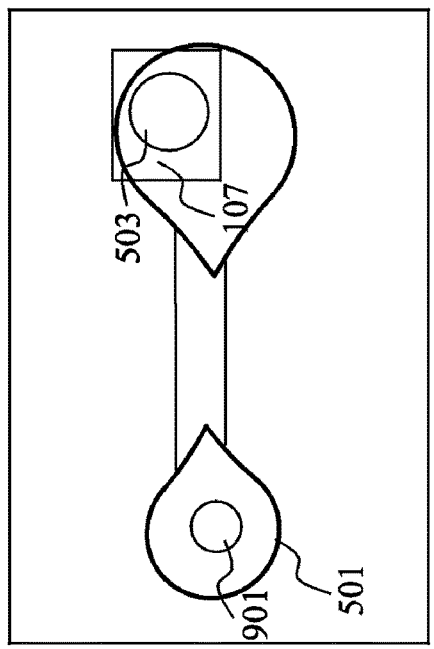
Figure 13B:
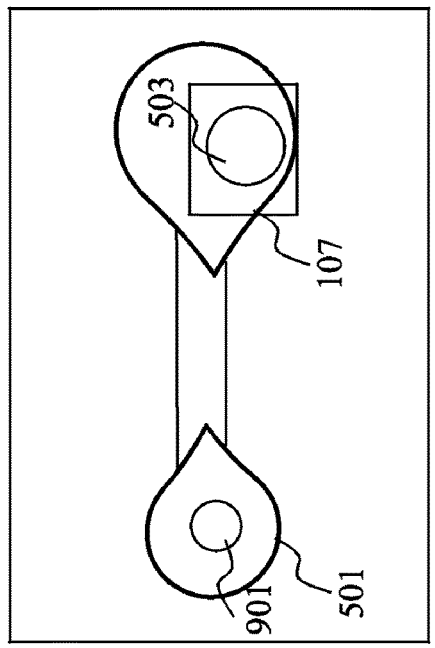

FIGS. 13A-13C illustrate an enlarged cross section and two associated top down views of the contact pad 107, the via 503, the redistribution layer 501, and the through via 901, with FIGS. 13B and 13C being top down views of FIG. 13A along line A-A'. By forming the openings for the vias 503 prior to attaching the dies (e.g., the first die 101 and the second die 103) to the carrier wafer 301, and then forming the redistribution layer 501 over the via 503, only the size of the land for the redistribution layer 501 needs to be considered in order to cover the die shift that occurs. As such, the die shift window is enlarged and it the bonding accuracy can be increased.

This is illustrated by the top down views of FIGS. 13B and 13C. In FIG. 13B, there is a chip shift in a first direction. However, due to the embodiments as described above, the redistribution layer 501 can still compensate for it in this direction. Additionally, as illustrated in FIG. 13C, even a chip shift in a different direction can also be compensated for by enlarging the land of the redistribution layer 501 over contact pad 107 and the via 503.

In accordance with an embodiment, a semiconductor device comprising a semiconductor die, the semiconductor die comprising a first side, a second side opposite the first side, and a first sidewall extending between the first side and the second side, is provided. A protective layer is over the semiconductor die, the protective layer comprising a second sidewall. Vias extend through the protective layer, and an encapsulant encapsulates the semiconductor die, the encapsulant in physical contact with the first side, the first sidewall, and a first portion of the second sidewall, wherein a second portion of the second sidewall is not in physical contact with the encapsulant.

In accordance with another embodiment, a semiconductor device comprising a semiconductor die with a first sidewall and a first protective layer over the semiconductor die, wherein a second sidewall of the first protective layer is recessed from the first sidewall of the semiconductor die, is provided. An opening is through the first protective layer, and an encapsulant covers the first sidewall and the second sidewall, wherein the encapsulant has a top surface that is planar with the first protective layer. A conductive material fills the opening and extending over the encapsulant.

In accordance with another embodiment, a method of manufacturing a semiconductor device comprising forming a first protective layer over a first die and a second die and encapsulating the first die and the second die with an encapsulant, wherein the encapsulant has a greater thickness than the first die is provided. A conductive material is formed that extends through the first protective layer and extends over the encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a semiconductor die with a first sidewall;
    a first protective layer over the semiconductor die, wherein a second sidewall of the first protective layer is recessed from the first sidewall of the semiconductor die;
    an opening through the first protective layer;
    an encapsulant covering the first sidewall and the second sidewall, wherein the encapsulant has a top surface that is planar with the first protective layer;
    a conductive material filling the opening and extending over the encapsulant; and
    a through via extending through the encapsulant and in electrical connection with the conductive material.

2. The semiconductor device of claim 1, further comprising a second protective layer over the conductive material.

3. The semiconductor device of claim 2, further comprising an underbump metallization extending through the second protective layer to make electrical contact with the conductive material.

4. The semiconductor device of claim 2, wherein the second protective layer has a third sidewall aligned with a fourth sidewall of the encapsulant.

5. The semiconductor device of claim 1, wherein the conductive material is in physical contact with the encapsulant.

6. The semiconductor device of claim 5, wherein the conductive material is copper.

7. A semiconductor device comprising:
    a protective material overlying a first surface of a semiconductor die, the protective material having a second surface facing away from the first surface;
    an encapsulant encapsulating the protective material and the semiconductor die, wherein the encapsulant extends at least partially over the first surface and wherein the encapsulant has a third surface that is planar with the second surface; and
    a conductive material extending through the protective material to make electrical contact with the semiconductor die, the conductive material also extending over the third surface, wherein the conductive material comprises a seed layer.

8. The semiconductor device of claim 7, wherein the conductive material is a redistribution layer.

9. The semiconductor device of claim 8, further comprising a second protective layer at least partially covering the redistribution layer.

10. The semiconductor device of claim 9, further comprising an underbump metallization extending through the second protective layer and in contact with the redistribution layer.

11. The semiconductor device of claim 7, further comprising a through via extending through the encapsulant.

12. The semiconductor device of claim 11, wherein the through via is in physical contact with the conductive material.

13. A semiconductor device comprising:
    a first surface, wherein the first surface comprises a protective material and an encapsulating material, wherein the protective material extends a first distance from the first surface to a second surface opposite the first surface and wherein the encapsulating material extends a second distance from the first surface to a third surface opposite the first surface, the second distance being greater than the first distance;
    a semiconductor die in physical contact with the second surface of the protective material, wherein the semiconductor die extends a third distance from the second surface to a fourth surface facing away from the second surface, wherein the second distance is at least as large as a sum of the first distance and the third distance, and wherein the protective material has a first width and the semiconductor die has a second width greater than the first width; and
    a conductive material extending over both the protective material and the encapsulating material, the conductive material also extending through the protective material to be in electrical contact with the semiconductor die, wherein the conductive material comprises a seed layer.

14. The semiconductor device of claim 13, further comprising a through via within the encapsulating material, the through via having a first height at least as large as the second distance.

15. The semiconductor device of claim 14, wherein the through via is physically in contact with the conductive material.

16. The semiconductor device of claim 13, further comprising an underbump metallization in electrical connection with the conductive material.

17. The semiconductor device of claim 16, wherein the underbump metallization is in physical contact with the conductive material.

18. The semiconductor device of claim 1, wherein the conductive material is a redistribution layer.

19. The semiconductor device of claim 1, wherein the through via is in physical contact with the conductive material.

20. The semiconductor device of claim 3, further comprising an external connection in physical contact with the underbump metallization.

* * * * *